United States Patent [19]
Hong et al.

[11] Patent Number: 5,252,177
[45] Date of Patent: Oct. 12, 1993

[54] METHOD FOR FORMING A MULTILAYER WIRING OF A SEMICONDUCTOR DEVICE

[75] Inventors: Jong-Seo Hong; Jin-Hong Kim; Jung-In Hong, all of Suwon, Rep. of Korea

[73] Assignee: SamSung Electronics Co., Ltd., Suwon, Rep. of Korea

[21] Appl. No.: 736,772

[22] Filed: Jul. 29, 1991

[30] Foreign Application Priority Data

Apr. 15, 1991 [KR] Rep. of Korea ............... 1991-6024

[51] Int. Cl.$^5$ .............. B44C 1/22; C23F 7/00
[52] U.S. Cl. ................... 156/643; 156/644; 156/657; 156/656; 156/667; 204/192.32; 437/228; 437/235
[58] Field of Search ............... 156/643, 644, 651, 652, 156/655, 656, 657, 659.1, 662, 667; 204/192.32, 192.35; 437/180, 187, 198, 199, 203, 228, 235, 238

[56] References Cited

U.S. PATENT DOCUMENTS 4,857,141 8/1989 Abe et al. ............... 156/644

Primary Examiner—William A. Powell
Attorney, Agent, or Firm—Robert E. Bushnell

[57] ABSTRACT

A method for forming a multilayer wiring, in a method for manufacturing a semiconductor device, is disclosed. The method comprises: forming a contact hole 33 on the surface of a conductive layer 29 by a photolithography, removing a photoresist by using plasma ashing at a predetermined temperature, pressure and amount of oxygen per unit cubic, and simultaneously forming a protective layer 35 consisting of a oxide layer on the surface of the exposed conductive layer. Thus, damage of the surface of wiring caused by the chemical reaction of an organic solvent and water in the subsequent process thereof, is prevented, to provide high density and high speed semiconductor integrated circuit whose electrode characteristics between two wiring layers is improved.

15 Claims, 2 Drawing Sheets

METHOD FOR FORMING A MULTILAYER WIRING OF A SEMICONDUCTOR DEVICE

FIELD OF THE INVENTION

The present invention relates to a method for manufacturing a semiconductor device, and more particularly to a method for forming multilayer wiring.

BACKGROUND OF THE INVENTION

Recently, the density of semiconductor devices and operating speeds thereof have been increased. However, in case of a semiconductor integrated circuit having conventional one layer wiring, a reduction in the width of metal wiring in the memory device increased electrical resistance. Thus, the power consumption increases. Accordingly, to enhance operating speed, multilayer wiring has been proposed. A material metal wiring is aluminum containing silicon of under 4% to prevent aluminum spike occurred when forming wiring with pure aluminum. However, aluminum wiring containing added copper added has been proposed to improve reliability.

FIGS. 1A and 1B illustrate a conventional method for manufacturing a semiconductor device having multilayer wiring. In the FIG. 1A, on a semiconductor substrate 1 of a first conductivity type, where field oxide layer 3 for isolation is formed, a first insulation layer 5, a first conductive layer 7, a second insulation layer 9, a second conductive layer 11 and a third insulation layer 13 are consecutively deposited. Then, a contact hole 15 is formed through selective etching of the third insulation layer 13 by photolithography. Thus, the top surface of the second conductive layer 11 is partially exposed. Here, the first conductive layer 7 is bit line, and the second conductive layer 11 is aluminum wiring containing silicon of about 1% and copper of about 0.5%. By employing the above mentioned aluminum in the metal wiring, hillock and electromigration characteristics can be improved as compared with conventional aluminum wiring containing only silicon. The wiring made of the second conductive layer 11 and another wiring (not shown) are contacted through the contact hole 15. In forming the described wiring of multilayer structure, in practice, underlying layer wiring can be damaged by the chemical reaction of copper component extracted into the grain boundary of the aluminum, water (H$_2$O) and organic solvents, etc, which occur during removal of the ordinary photoresist. That is, to expose the surface of the underlying layer wiring, plasma ashing (process of developing a photoresist and thereafter removing the photoresist remaining after plasma etching process), dipping in an organic solvent such that sulfate acid, rinsing with water and drying are progressively carried out to remove the remaining photoresist positioned on the upper surface of the insulation layer. At this time, the exposed portions of aluminum wiring containing copper directly contact the organic solvent and water. As a result, the copper component existing in grain boundary of the aluminum is discolored with black spots and pieces of the second conductive layer 11 may drop away. The size of these pieces can be 1μm in diameter. The resultant damage of the wiring is shown in the FIG. 1A. When an overlying layer wiring is formed by the vapor deposition and the underlying layer wiring is damaged, step coverage is inferior. Accordingly the overlying layer wiring is shorted or the contact area is decreased increasing contact resistance. Thus electrical characteristic of devices deteriorates.

FIG. 1B illustrates the cross sectional view of the conventional multilayer wiring. On the third conductive layer of aluminum, an overlying layer wiring 17 is disposed by formation of a pattern and selective etching. As shown in FIG. 1B, a portion of the overlying layer wiring contacting the underlying layer wiring small because of the interior step coverage.

As described above, conventional method has a problem that the wiring is damaged by exposure of the underlying layer wiring through the contact hole, when the remaining photoresist disposed over the underlying layer is removed after forming the contact hole on the underlying layer wiring. Therefore, reliable semiconductor integrated circuit is not obtained.

SUMMARY OF THE INVENTION

It is an object of the invention to provide a method for forming a multilayer wiring, and preventing damage of exposed wiring upon removing of a photoresist residue.

To achieve the above object, the method includes the steps of: forming a contact hole for contacting an underlying layer wiring and an overlying layer wiring, removing the remaining photoresist positioned on an insulation layer, the insulation layer being disposed on the underlying layer wiring, by plasma ashing under condition of the predetermined temperature, pressure and amount of oxygen per unit cubic, and simultaneously forming an oxide layer on the exposed underlying layer wiring through the contact hole; and, removing the oxide layer just before forming of the overlying layer wiring.

BRIEF DESCRIPTION OF THE DRAWINGS

The above objects and other advantages of the present invention will become more apparent by describing in detail the preferred embodiment of the present invention with the reference to the attached drawings, in which.

DETAILED DESCRIPTION OF THE PREFERRED EMBODIMENT

Figure 1A:
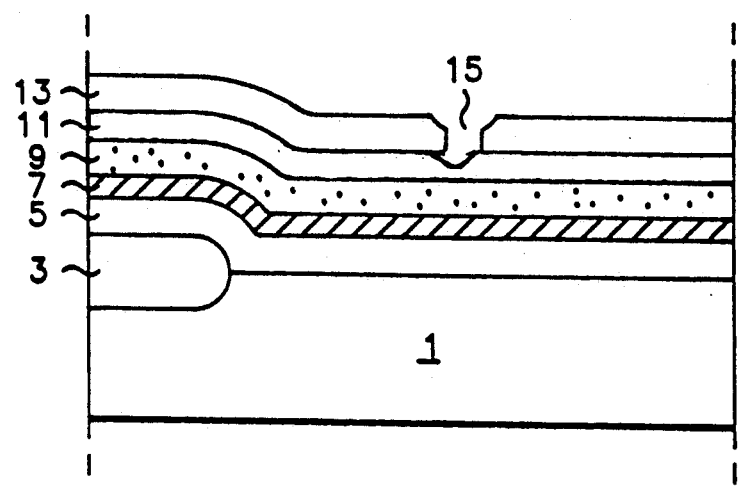
FIGS. 1A and 1B are views illustrating conventional manufacturing process.
Figure 1B:
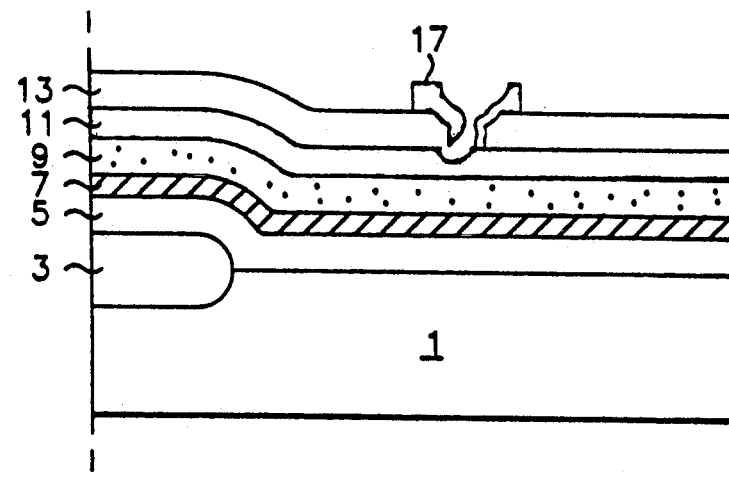
Figure 2A:
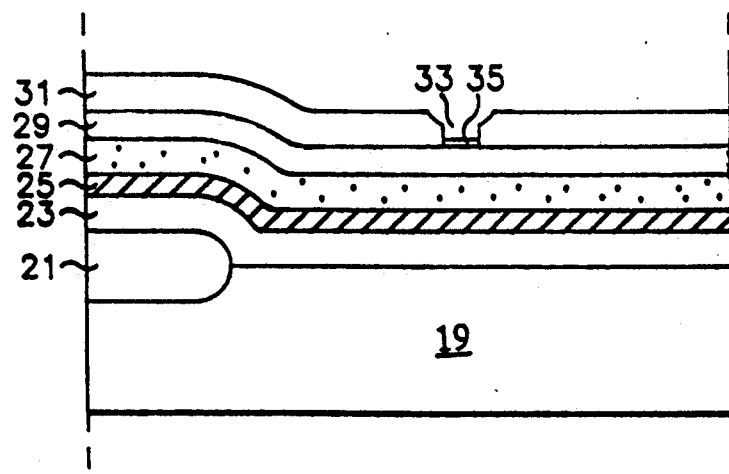
FIGS. 2A and 2B are views illustrating manufacturing process according to the present invention.

Referring to FIG. 2A, on the surface of a semiconductor substrate 19, with a first conductivity type, having field oxide layer 21 formed thereon, a first insulation layer 23, a first conductive layer 25, a second insulation layer 27, a second conductive layer 29 and a third insulation layer 31 are consecutively deposited. Here, the first conductive layer 25 is the bit line, and the second conductive layer 29 is aluminum wiring containing silicon of about 1% and copper of about 0.5%. The wiring is composed of the second conductive layer, and another wiring are contacted through the contact hole 33. Then, oxygen plasma ashing is performed to remove a remaining photoresist (not shown) positioned on top surface of the third insulation layer 31. At this time, the process conditions are 500 SCCM (Standard Cubic Centimeter) of oxygen gas, 4–5 Torr of the pressure and 250° C.–350° C. for the temperature of the substrate. As a result, the photoresist is removed, and simultaneously the exposed wiring surface through the contact hole 33 is oxidized, thereby forming aluminum oxide layer (Al$_2$O$_3$) 35 with the thickness of 30Å–80Å. The aluminum oxide layer 35, an insulation layer, prevents reaction between the wiring, an organic solvent and water in subsequent processing to remove the photoresist, in other words, the dipping in the organic solvent and rinse, etc., Because of the above result, the wiring is protected and not damaged. After removing all the remaining photoresist on the third insulation layer 31, to form a low resistance contact between the underlying layer wiring and the overlying layer wiring, the aluminum oxide layer 35 is subjected to an ordinary argon sputtering etching.

Figure 2B:
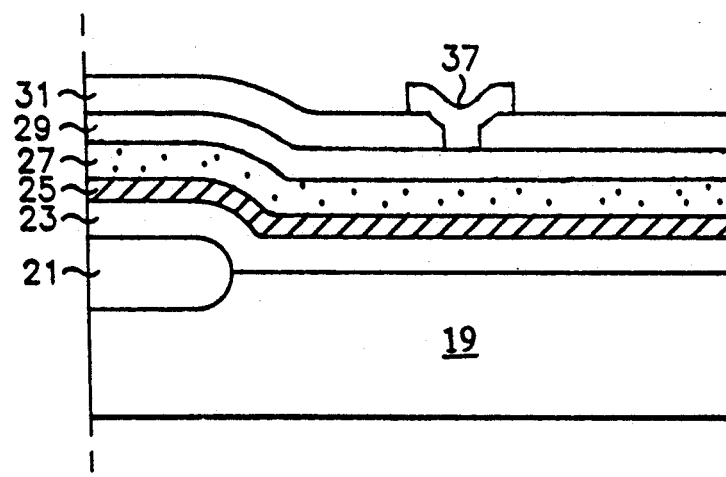

As shown in FIG. 2B, an overlying layer wiring 37 is formed by patterning after depositing a third conductive layer of aluminum alloy containing a get amount of copper. Here, the third conductive layer has better step coverage because the underlying layer wiring is undamaged. Accordingly, the contact area between the underlying layer wiring and the overlying layer wiring is maximized, achieving a low resistance contact.

As described above, in the method for forming the multilayer wiring according to the present invention, a protective layer of oxide layer is simultaneously coated on the top exposed surface of the underlying layer wiring, through the contact hole, with removing of the photoresist by photoresist ashing process. Therefore, the damage of the surface of wiring due to chemical reaction of an organic solvent and water in the subsequent process, is prevented so that the underlying layer wiring having better step coverage can be formed. As a result two wiring layers are interconnected with minimum contact resistance drastically enhancing electrode characteristics between the two wiring layers. Accordingly, high-density and high-speed semiconductor integrated circuit having the improved reliability can be obtained.

While the invention has been particularly shown and described with the reference to the preferred embodiment of the present invention thereof, it will be understood by those skilled in the art that the foregoing and other changes in form and details may be made without departing from the spirit and scope of the present invention.

What is claimed is:

1. A method for forming multilayer wiring in a semiconductor device, said semiconductor device comprising a semiconductor substrate and insulation layers and conductive layers formed over a top surface of said semiconductor substrate, said method comprising the steps of:

forming a contact hole by selectively etching out a region of an insulation layer disposed on a first conductive layer using a photoresist pattern to thereby expose a top surface of said first conductive layer;

removing said photoresist pattern positioned on said insulation layer by plasma etching simultaneously forming a protective oxide layer on the exposed top surface of said first conductive layer; and removing said oxide layer before forming a second conductive layer on said exposed top surface of said first conductive layer.

2. The method as claimed in claim 1, wherein said first conductive layer is aluminum.

3. The method as claimed in claim 2, wherein during said plasma ashing, said semiconductor substrate is heated to a temperature of 250°C.–350°C. in a reaction room having an oxygen atmosphere at a pressure of 4-5 Torr.

4. The method as claimed in claim 1, wherein said oxide layer is aluminum oxide layer and has a thickness of 30Å–80Å.

5. The method as claimed in claim 1, wherein said oxide layer is removed by argon sputtering etching.

6. The method as claimed in claim 1, wherein said plasma etching is performed in 500 SCCM of oxygen gas and at a pressure of 4–5 Torr.

7. The method as claimed in claim 6, wherein during said plasma ashing a temperature of said semiconductor substrate is 250°–350° C.

8. A method for forming an electrical connection on a semiconductor substrate between a first conductive layer and a second conductive layer through an intervening insulation layer formed over said first conductive layer, said method comprising the steps of:

forming a photoresist pattern on said insulation layer;

after forming said photoresist pattern, forming a contact hole by selectively etching out exposed regions of said insulation layer to expose a top surface of said first conductive layer;

removing remaining photoresist positioned on said insulation layer by plasma ashing to simultaneously form a protective oxide layer on said exposed top surface of said first conductive layer; and removing said oxide layer before forming said second conductive layer on said exposed top surface of said first conductive layer.

9. The method as claimed in claim 8, wherein said plasma ashing is performed in 500 SCCM of oxygen gas and at a pressure of 4–5 Torr.

10. The method as claimed in claim 9, wherein during said plasma ashing a temperature of said semiconductor substrate is 250°–350° C.

11. The method as claimed in claim 8, wherein said first conductive layer is mostly aluminum.

12. The method as claimed in claim 8, wherein said first conductive layer is aluminum containing approximately one percent silicon and approximately one half percent copper.

13. The method as claimed in claim 8, wherein said protective layer is an aluminum oxide layer.

14. The method as claimed in claim 13, wherein said protective layer has a thickness of 30Å–80Å.

15. The method as claimed in claim 8, wherein said protective layer is removed by argon sputtering etching.

* * * * *

UNITED STATES PATENT AND TRADEMARK OFFICE
CERTIFICATE OF CORRECTION

PATENT NO. : 5,252,177
DATED : October 12, 1993
INVENTOR(S) : Jong-Seo Hong

It is certified that error appears in the above-indentified patent and that said Letters Patent is hereby corrected as shown below:

Column 2,   Line 9,   Change "interior" to --inferior-- .

Signed and Sealed this

Nineteenth Day of September, 1995

Attest:

BRUCE LEHMAN

*Attesting Officer*   *Commissioner of Patents and Trademarks*